(12) United States Patent
Breece, III et al.

(10) Patent No.: US 9,099,967 B2
(45) Date of Patent: Aug. 4, 2015

(54) INCREASING GROUND NOISE REJECTION IN AUDIO SYSTEMS

(71) Applicant: Apple Inc., Cupertino, CA (US)

(72) Inventors: David C. Breece, III, Sunnyvale, CA (US); Nathan Johanningsmeier, San Jose, CA (US); Cara S. Yang, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 276 days.

(21) Appl. No.: 13/630,202

(22) Filed: Sep. 28, 2012

(65) Prior Publication Data

US 2014/0093103 A1    Apr. 3, 2014

(51) Int. Cl.
*H04B 15/00* (2006.01)
*H03F 1/26* (2006.01)
*H03F 3/181* (2006.01)
*H03F 3/45* (2006.01)
*H03F 3/68* (2006.01)

(52) U.S. Cl.
CPC ............... *H03F 1/26* (2013.01); *H03F 3/181* (2013.01); *H03F 3/45475* (2013.01); *H03F 3/68* (2013.01); *H03F 2203/45528* (2013.01); *H03F 2203/45594* (2013.01)

(58) Field of Classification Search
CPC ..... H04R 1/1041; H04R 2420/09; H04R 5/04
USPC .................................................. 381/74, 94.6
See application file for complete search history.

(56) References Cited

U.S. PATENT DOCUMENTS

| | | | |
|---|---|---|---|
| 4,146,291 A * | 3/1979 | Goff et al. ..................... 439/90 |
| 5,001,440 A | 3/1991 | Zerod | |
| 5,677,959 A | 10/1997 | Silfvast | |
| 5,818,672 A | 10/1998 | Hilbe | |
| 5,832,438 A | 11/1998 | Bauer | |
| 6,566,767 B1 | 5/2003 | Tardo | |
| 7,366,577 B2 | 4/2008 | DiSanza et al. | |
| 7,454,535 B2 | 11/2008 | Hwang et al. | |
| 7,579,832 B1 | 8/2009 | Blackburn et al. | |
| 7,769,187 B1 | 8/2010 | Farrar et al. | |
| 8,311,765 B2 * | 11/2012 | Nielsen et al. ................ 702/130 |

(Continued)

OTHER PUBLICATIONS omous Audio Headset Switch", Check for Samples: TS3A225E, Copyright 2011 Texas Instruments Incorporated, SCDS329—Nov. 2011, www.it.com, (1 page).
"Low-Power Audio CODEC with DirectDrive Headphone Amplifiers", MAX9856, Maxim Integrated Products, Product Information, 19-1288; Rev. 1; Sep. 2008, (pp. 1-46).
"Low-Power Audio CODEC with DirectDrive Headphone Amplifiers", MAX9856, Maxim Integrated Products, Product Information, 19-1288; Rev 2; Dec. 2011, (pp. 1-46).

(Continued)

*Primary Examiner* — Alexander Jamal
(74) *Attorney, Agent, or Firm* — Blakely, Sokoloff, Taylor & Zafman LLP

(57) ABSTRACT

An audio source device has an audio connector to which an external load can be connected. An audio signal is amplified and then driven through the connector, wherein the amplification process uses feedback from the return pin of the connector. The return pin is directly connected to a ground break resistor circuit. The ground break resistor circuit is connected between the return pin of the audio connector and circuit ground. A determination is made as to whether the connected external load has a low impedance or a high impedance. When a low impedance load is detected, such as a headset, the ground break resistor circuit is essentially short-circuited. When a high impedance load is detected, the ground break resistor circuit is maintained and its value is set in accordance with the detected load. Other embodiments are also described.

17 Claims, 8 Drawing Sheets

(56) References Cited

U.S. PATENT DOCUMENTS

| | | |
|---|---|---|
| 8,340,312 B2 | 12/2012 | Johnson et al. |
| 2002/0001381 A1* | 1/2002 | Mori ........................ 379/387.01 |
| 2002/0036913 A1 | 3/2002 | Suzuki et al. |
| 2011/0012667 A1 | 1/2011 | Yamkovoy |
| 2011/0128019 A1 | 6/2011 | Saito |
| 2011/0268289 A1* | 11/2011 | Baranwal et al. ............... 381/74 |
| 2014/0093103 A1 | 4/2014 | Breece, III et al. |

OTHER PUBLICATIONS

"Multi-Channel High Definition Audio CODEC", WM8860, Wolfson® Microelectronics, Product Brief, Apr. 2011, Rev. 3.1, pp. 1-24.

Crump, Stephen, "Ground Loop Break Circuits and Their Operation", Application Report, SLOA143—Oct. 2009, Audio Products, copyright 2009 Texas Instruments Incorporated, (pp. 1-14).

* cited by examiner

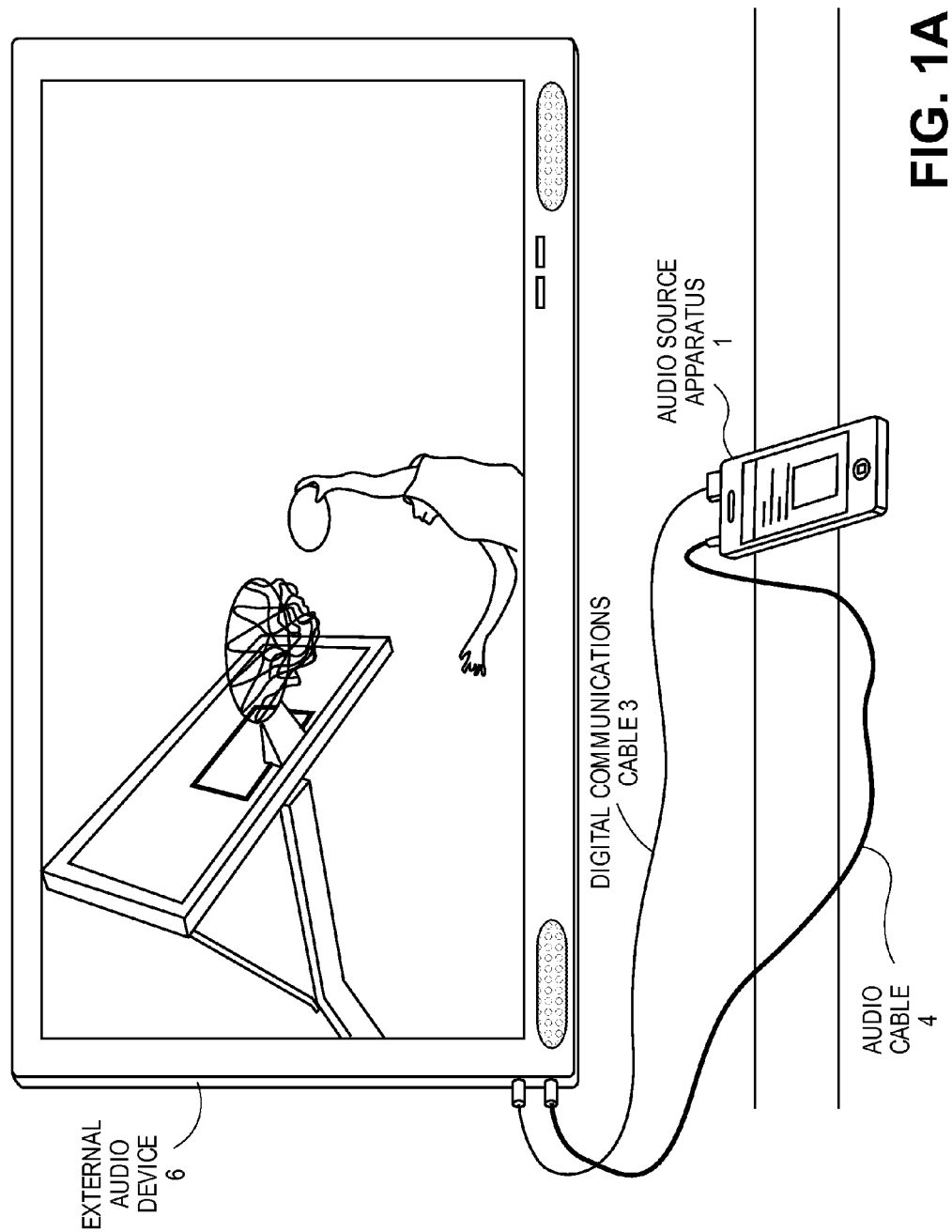

INCREASING GROUND NOISE REJECTION IN AUDIO SYSTEMS

An embodiment of the invention relates to techniques for reducing ground loop noise in audio systems, but without causing additional cross-talk noise. Other embodiments are also described.

BACKGROUND

When a grounded desktop computer or a grounded laptop computer that is plugged into an AC power adapter is connected to a grounded external audio device such as, for example, a powered loud speaker, a ground loop is created due to the sharing of the 3-prong AC wall power plug's ground pin, by both devices. The ground loop allows a portion of a return current, which is not related to the audio signal but is nevertheless within the audible frequency range, to return to earth ground through the audio connection. In other words, some of the return current of the non-audio connection in the external device (here, the powered loud speaker unit) can pass through the return path to the audio source device, rather than passing entirely back to earth ground through the ground pin of the external device's AC wall power connection. Such interference may often be heard as a buzzing sound for example. In most cases, this interference may be reduced using a ground loop break circuit, which inserts a low value resistor, e.g. from just a few ohms to 20 ohms in series between the audio ground and the return path in the desktop computer. In addition, a differential input amplifier is used when driving the audio signal into the external device, to cancel out the potential difference in the different ground nodes.

SUMMARY

It has been discovered that although the ground loop break circuit is effective in reducing interference caused by return currents that do not follow their normal expected path, an audio system that features such a ground loop break circuit suffers from increased cross-talk when the external audio device is, for example, a headset having a pair of earphones. An embodiment of the invention is a method for increasing the ground noise rejection in such audio systems, without substantially increasing the risk of cross talk. In one embodiment, an audio source apparatus contains an audio source, an audio connector whose signal out pin and return pin are to be connected to an external audio load, and a differential input amplifier that has a signal input coupled to the audio source. The amplifier has a feedback input, e.g. directly connected to the positive or non-inverting input of an operational amplifier (op amp) that is configured to operate as a linear, closed feedback loop, differential input single-ended output amplifier. A variable resistor circuit provides variable resistance between a first node and a second node, where the first node may be the feedback input node of the differential input amplifier. The variable resistor circuit has a control input for setting the variable resistance. A switch circuit is in parallel with the variable resistor circuit. A load detector detects the type of external audio load that is connected to the connector, and on that basis can set the switch circuit into either an open state or a closed state, and can also set the variable resistance.

The external audio load may be any suitable external sound producing device, that is, external to the audio source device such that it needs to be connected by the audio cable.

The load detector may be a load impedance sensing circuit. The audio connector may be a 3.5 mm tip ring ring sleeve (TRRS) audio connector. The load detector may be able to sense a DC impedance range on the audio signal out pin. The ranges may include a low impedance range, for example, 1-700 ohms, and a high impedance range, e.g. above 1,000 ohms. The former covers typical wired headsets or headphones (earphones) whereas the latter covers connections to the line-in input of an audio receiver such as a powered speaker, a home entertainment audio receiver-amplifier, or a vehicle audio system.

In one embodiment, the audio source apparatus is a portable personal audio device such as a laptop or notebook computer that can also be AC wall-powered via an external AC wall-power adapter (and that may be grounded through the ground pin of the AC wall plug). In another embodiment, the audio source apparatus is a desktop computer.

The above summary does not include an exhaustive list of all aspects of the present invention. It is contemplated that the invention includes all systems and methods that can be practiced from all suitable combinations of the various aspects summarized above, as well as those disclosed in the Detailed Description below and particularly pointed out in the claims filed with the application. Such combinations have particular advantages not specifically recited in the above summary.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

FIG. 1A illustrates an audio system having two components that are connected to each other by an audio cable, as well as another cable.

DETAILED DESCRIPTION

Several embodiments of the invention with reference to the appended drawings are now explained. Whenever the shapes, relative positions and other aspects of the parts described in the embodiments are not clearly defined, the scope of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Figure 1B:
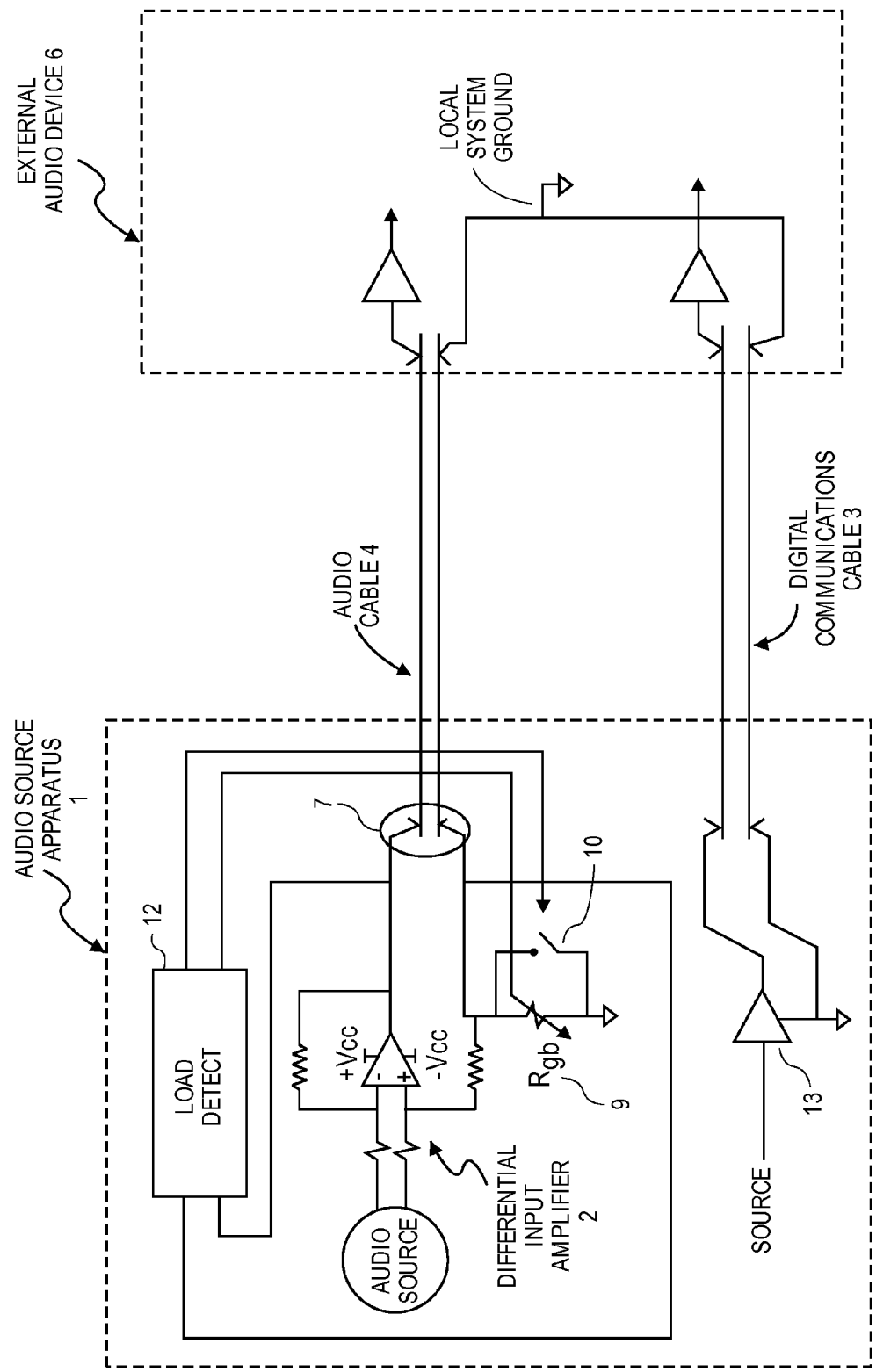
FIG. 1B is a combined circuit schematic and block diagram thereof.

FIG. 1B is a combined circuit schematic and block diagram of the audio system depicted in FIG. 1A having two components that are connected to each other by an audio cable 4, as well as another cable 3. An audio source apparatus or device 1 may be a laptop or notebook computer, a tablet computer, a smartphone, or other consumer electronics audio device that contains an audio source. The audio source may include a digital audio processor (a programmed processor or a programmed special purpose processor) and a digital-to-analog converter whose input is coupled to the output of the digital audio processor. An audio source within device 1 can produce an audio signal by converting any digital audio bitstream into analog form. The digital-to-analog converter has an output that is coupled to the signal input of a differential input amplifier 2 (differential input to single-ended output) as shown in FIG. 1B. An audio connector 7 serves to electrically connect the amplified audio signal to an external sound producing device 6, through a signal-out pin and a return pin. This enables the audio source device 1 to play a wide range of digital audio items, including music files, movie files, and streaming Internet content. In addition, the audio source may also be for a telephony application, where a downlink audio signal (containing speech of a far-end user during a voice or video call) is being converted into analog form and driven by the differential input amplifier 2.

The differential input amplifier 2 serves to amplify the audio signal. The differential input amplifier 2 is depicted as being implemented in this case as a differential to single-ended amplifier, using a single op amp (e.g., a dual-supply op amp as shown in FIG. 1B). Other circuit designs for the amplifier 2 are possible. The amplifier 2 may be capable of driving a variety of different audio loads, including low impedance loads such as unpowered headsets (earphones), as well as higher impedance loads such as a home entertainment receiver, a vehicle entertainment receiver, and a powered speaker unit. An electrical accessory connector 7 is provided for this purpose, referred to here as an audio connector although it need not be limited to audio but can also carry other general purpose data or other communication signals. The connector may be, for example, a 3.5 mm TRRS (tip, ring, ring, sleeve, also referred to as a headphone plug) type of connector, or it may be an RCA type connector. An attached audio cable 4 serves to transfer the audio signals to an external audio device 6. FIG. 1A shows the case where the external audio device 6 is a television unit. The external audio device 6 may alternatively be a vehicle entertainment system or other higher input impedance audio load having a line-in input. It may, however, also be a low impedance load such as a headset. In most instances, the external audio device also includes a speaker (not shown) that is driven by the audio signal received from the cable 4. There may or may not be a separate connector within the external audio device (at the end of the audio cable 4).

What should be clear in FIG. 1A and FIG. 1B is that both the audio source device 1 and the external audio device have local system grounds that are connected to each other by a low impedance path through another cable 3 (separate from the audio cable 4). This causes the creation of a ground loop, such that a communications or other data signal being driven on the other cable 3 may cause audible (frequency) content that can return through the audio cable 4 to in part cause a voltage change on the local system ground of the receiving side, i.e. in the external audio device 6. To alleviate this ground noise interference, a variable resistor circuit 9, which contains a ground loop break resistor, $R_{gb}$, is provided in the audio source device 1. In particular, the variable resistor circuit 9 provides a variable resistance (e.g., via passive resistors—see FIG. 4) between a first node and a second node, wherein the first node is directly connected to the return pin of the audio connector 7 and to the feedback input of the amplifier 2 as shown. The second node is directly connected to the ground plane or circuit ground of the audio source device 1. In other words, a variable resistance $R_{gb}$ is connected between the return pin of the connector 7 and the local system ground. The variable resistance value $R_{gb}$ may be set, for example, to any one of several discrete values that have been selected between, for example, the range 1 ohm to 60 ohms. It is expected that the variable resistor circuit 9 should have a digital control input that allows the discrete resistors to be switched in or out, for example, in accordance with the approach shown in FIG. 4 described below.

Coupled in parallel with the variable resistor circuit 9 is a switch circuit 10 that also has a control input. The switch circuit 10 has two different and stable states, alternately creating essentially a short circuit in one state, and essentially an open circuit in another, while connected to the first and second nodes. The control inputs of the switch circuit 10 and that of the variable resistor circuit 9 are under control of a load detector 12. When the switch circuit 10 is closed, the variable resistor circuit 9 is essentially removed or short-circuited, thereby directly connecting the power return pin of the audio connector 7 as well as the feedback point for the differential amplifier, to local circuit ground. This corresponds to the situation where essentially no ground break resistance has been inserted between the return pin of the connector 7 and the differential input amplifier's feedback input and the local circuit ground on the other. That situation is desirable when the external audio device 6 does not cause the creation of a ground loop. For example, referring now to FIG. 3A and FIG. 3B, the external audio device 6 receiver in that case is a wired headset, where no ground loop is created when the wired headset is connected to the audio connector. As seen in FIG. 3B, the switch 10 that is in parallel with the ground break resistor is now closed, which helps reduce the likelihood of cross-talk between the left and right channels of the wired headset, as well as the microphone channel.

Referring back to FIG. 1, the ground loop in this case was created when the external audio device 6 and the audio source device 1 are connected by a further cable 3 that has a return path which is coupled through a low impedance path to the local circuit grounds of both the source and external devices. This other cable 3 may be, for example, a data communications cable, or other means of digital media content transfer, such as a digital video interface cable.

The determination of the type of external audio load that is present on the audio cable 4, which informs the decision of whether to open or close the switch 10 and what value to set the variable resistance of the variable ground break resistor circuit 9, can be made using the load detector 12. The load detector 12 may be a load impedance sensing circuit that is able to sense, for example, the DC impedance looking out of the audio source device 1 into the port defined by a signal out pin and a return pin of the connector 7. The load detector 12 may sense a low impedance when the external audio load is a wired headset, as in FIG. 3A, 3B, but a high impedance when the external audio load is an audio receiver as in FIGS. 1A, 1B or a powered speaker unit as in FIGS. 2A, 2B. In the latter instances, the switch 10 is commanded to be open, and the variable resistor circuit 9 may also be adjusted to tune the ground break resistor Rgb in view of the detected load impedance. Viewed another way, the load detector 12 may sense impedance out through the signal out pin of the audio connector 7, and at least on that basis is able to control whether the first and second nodes of the variable resistor circuit 9 are connected by essentially a short circuit or by an open circuit. In addition, the load detector 12, at least based on having sensed the impedance of the external audio load, will set the variable resistance $R_{gb}$ so that a tuning effect may be achieved, to thereby improve the ground noise rejection capability.

The audio source, the differential input amplifier 2, the audio accessory connector 7, as well as the other components depicted in FIG. 1B including the variable resistor circuit 9, the switch 10, and the load detector 12 may all be protected by, or integrated within, the same housing of the audio sound device 1, e.g. where the housing may be that of a desktop computer, a laptop or notebook computer, a smart phone, a tablet computer, a home entertainment system enclosure, or a vehicle audio system enclosure.

In FIG. 1B, the audio source device 1 also includes a data driver 13 that is coupled to the ground plane of the audio source device 1 as shown, and whose output is connected to a signal out pin of the further connector, which is connected through the further cable 3 to the external audio device 6.

Figure 2A:
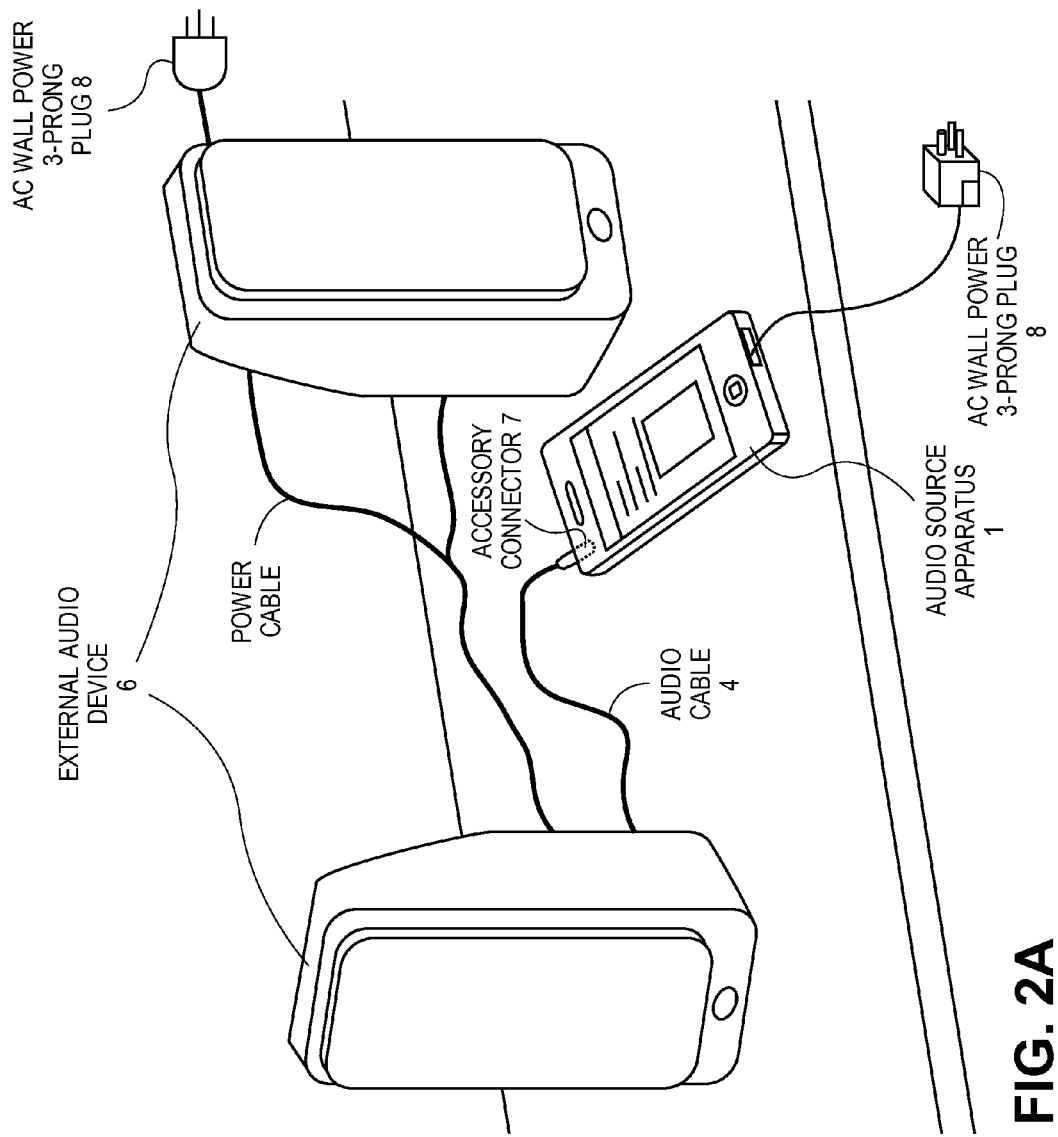
FIG. 2A illustrates another audio system, namely a wall-powered audio source device and a wall-powered speaker unit.
Figure 2B:
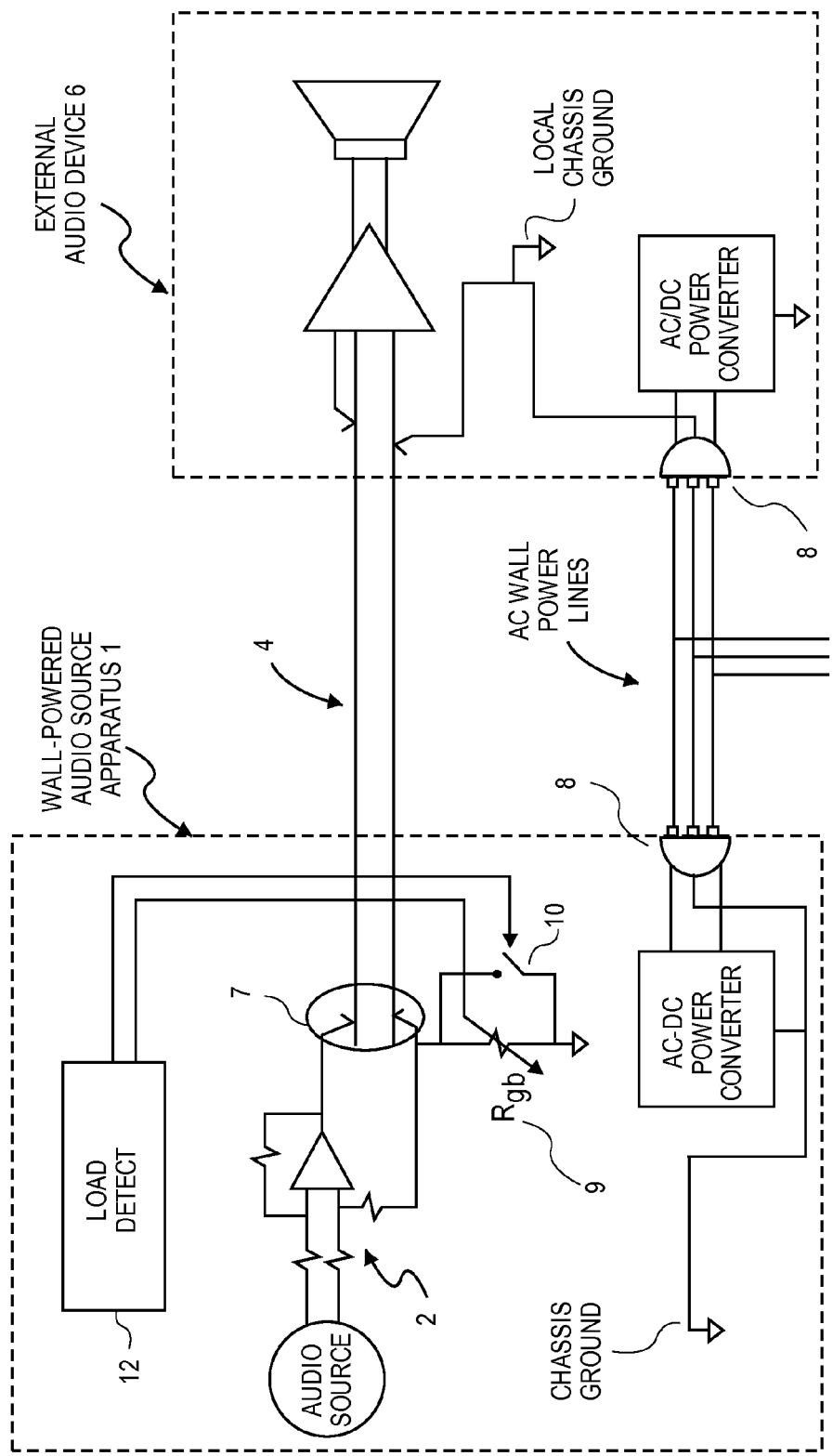
FIG. 2B is a combined block diagram and circuit schematic thereof.

Referring now to FIGS. 2A, 2B, these illustrate the case where the audio source device 1 is a wall-powered computer and the external audio device 6 is a wall-powered speaker unit. The audio source device 1 in this example may be a desktop computer, but it may also be a laptop or notebook computer or other portable device as shown, that has been connected to an external AC wall-power adapter. In both instances, the ground pin of a 3-prong AC wall plug 8 is electronically shared by various components within the audio source device, and may be connected to a chassis ground point—see FIG. 2B. Thus, the amplifier 2, as well as the variable resistor circuit 9 and the switch 10 all use a connection to the common chassis ground, which in this case is also connected to the ground pin of the 3-prong AC wall plug 8. The formation of the ground loop is apparent in this case as being through the ground wire that traverses a wall (one of three AC wall-power lines, in this case ground, neutral, and hot).

In both the audio source device 1 and the external audio device 6, an AC to DC power converter is provided that produces the DC power needed to run the various components of the device in each instance, while at the same time having the ground pin of the local 3-prong AC wall plug 8 connected to the local chassis ground. Thus, the ground loop in FIGS. 2A, 2B is created differently than in FIGS. 1A, 1B, although the issue of ground noise or interference is present in both cases.

In the case of the external audio device 6 of FIGS. 2A, 2B being a powered speaker unit, the audio cable 4 delivers the audio signal from the audio source device 1 to an amplifier in the external audio device 6 which may be referenced (or may use a power supply return path) to the local chassis ground. The received audio signal is then amplified, and is then driven through a speaker as shown. Note that in this case, the entire path starting from the audio source through the amplifier 2 in the source device 1, and then through the power amplifier in the external audio device 6, may be an analog path.

Figure 3A:
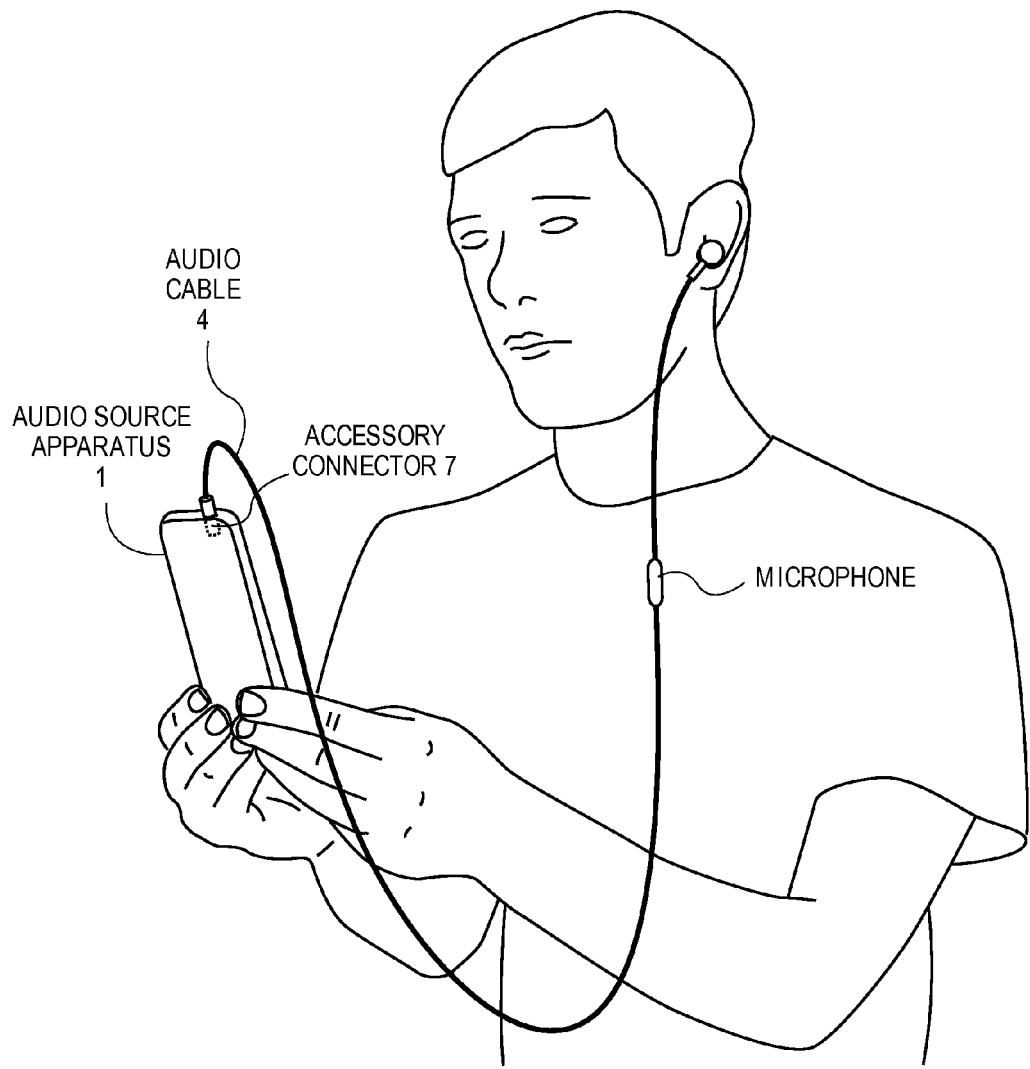
FIG. 3A illustrates yet another audio system, namely an audio source device having an audio connector that is connected to a wired headset.
Figure 3B:
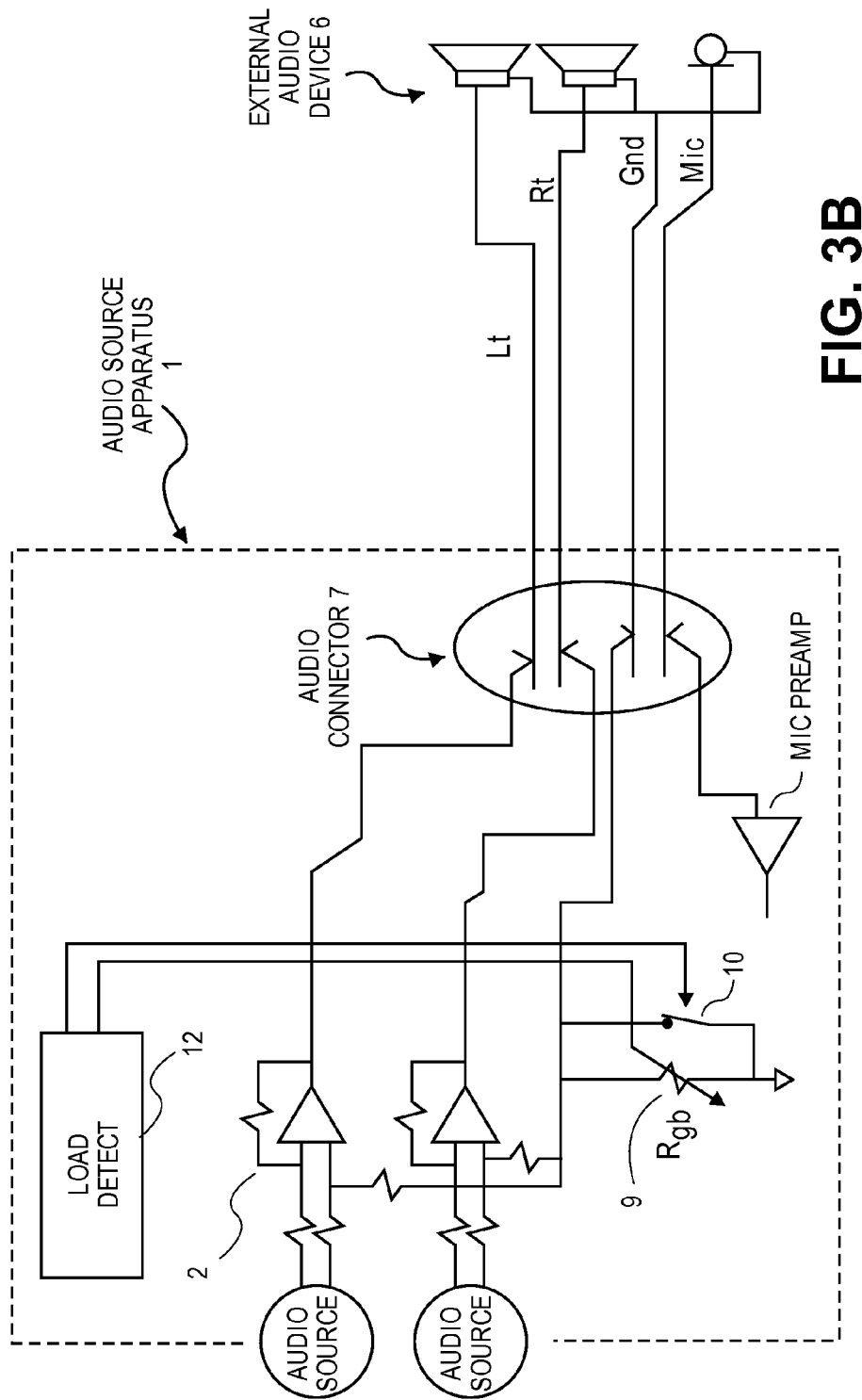
FIG. 3B is a combined block diagram and schematic thereof.

A similar analog path is also present in the embodiment of FIGS. 3A, 3B, where the audio source device 1 is connected to the external audio device 6 being in this case a wired headset. In this example the audio source device has two channels (left and right), each having its own differential input amplifier 2 and audio source, although in this case both differential input amplifiers may share the same feedback input point that is directly connected to the return pin of the accessory connector 7. The wired headset also has in this example a microphone (one or more microphones), where the microphone and the left and right speakers all share the same power supply return path through a return pin of the audio accessory connector 7. The microphone pin in this case is a signal-in pin of the audio accessory connector 7, which is routed to a microphone pre-amplifier within the audio source device 1, as shown.

Figure 4:
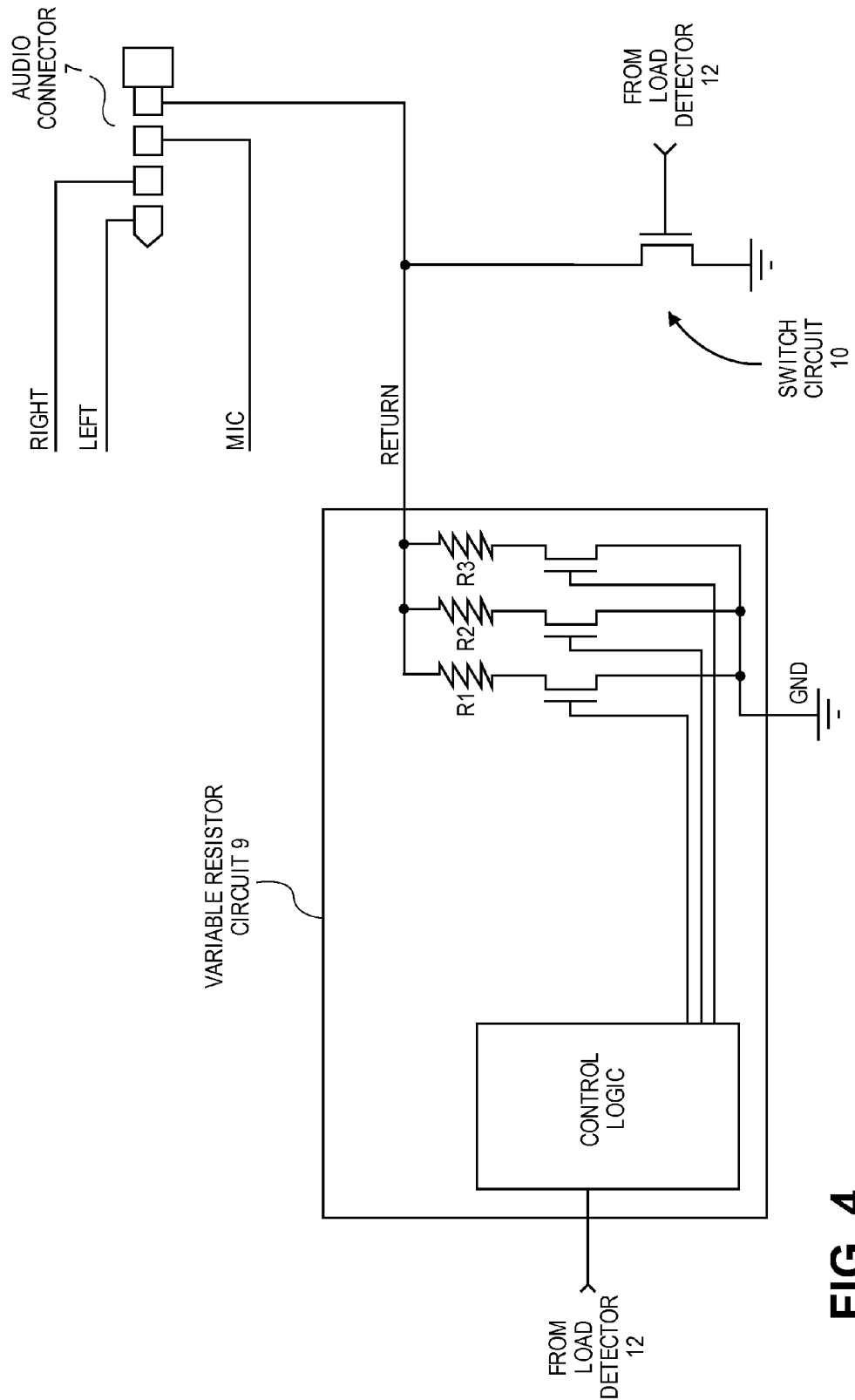
FIG. 4 is a circuit schematic of a variable resistor circuit that has a bank of individually selectable resistance sections being coupled to a return pin of a TRRS audio connector.

Turning now to FIG. 4, this is a specific example of the variable resistor circuit 9. In this case, node 1 is directly connected to the sleeve of a TRRS connector, while node 2 is connected to circuit ground. Alternatively, other audio connectors can be used. The transistors for R1, R2 and R3 may individually be turned on (through external address and data signals translated by the control logic), into any suitable combination, to yield the desired $R_{gb}$. In this case, seven different resistance values are possible between assuming that R1, R2 and R3 are all of different values.

In accordance with another embodiment of the invention, a method for operating an audio source device having an audio connector may proceed as follows. First, a determination is made as to whether a low impedance load or a high impedance load is connected to a signal out pin of the audio connector. Note that there may be additional ranges of impedance detection, e.g. a middle impedance load. Based at least in part on the determined load impedance, the following operations may be completed. If a low impedance load is detected, the variable resistor circuit is essentially short-circuited, but if a high impedance load is detected, the variable resistor circuit is "maintained" (e.g., by opening the switch 10). A resistance value $R_{gb}$ is set in accordance with the determined load. In this case, a finer granularity determination of the load impedance may be made to determine which of several possible $R_{gb}$ resistance values would be most suitable in order to provide greater ground noise rejection.

Once the switch circuit 10 has been opened or closed as determined above, and optionally the variable resistance value $R_{gb}$ has been set, an audio signal may be amplified (e.g., using a differential input single-ended output amplifier) and then driven through the signal out pin of the connector 7, while using feedback from the return pin of the connector 7, and using a power supply return path though the circuit ground of the audio source device 1. The amplifier may be configured as described above in FIG. 1B, 2B, or 3B using a single operational amplifier, or it may be a more complex circuit.

The determination of load impedance as described above encompasses a variety of different techniques. For instance, the actual load impedance can be sensed, by sensing the voltage and current through the signal-out pin of the audio connector 7, and then compared to a predetermined range. In another embodiment, the load impedance is determined based on a predetermined identification code (e.g., a digital code) having been recognized. The code can be generated by a circuit, for example, in a headset housing, that signals the code though one of the signal pins of the connector 7. In another approach, the mere presence of a microphone (sensed through the mic pin) may indicate a particular type of headset (and hence a particular, expected load impedance). An alternative is to "manually" determine the load impedance, for example, via user selection of one of several possible types of external audio load identifiers. For instance, the user may be presented with a list of options in a graphical user interface of the audio source device 1. The options may include a list of possible external audio loads (e.g., headsets from different manufacturers) that have been determined by the manufacturer of the audio source device 1 as being capable of interfacing with the source device 1 and benefiting from the improved ground noise rejection.

Figure 5:
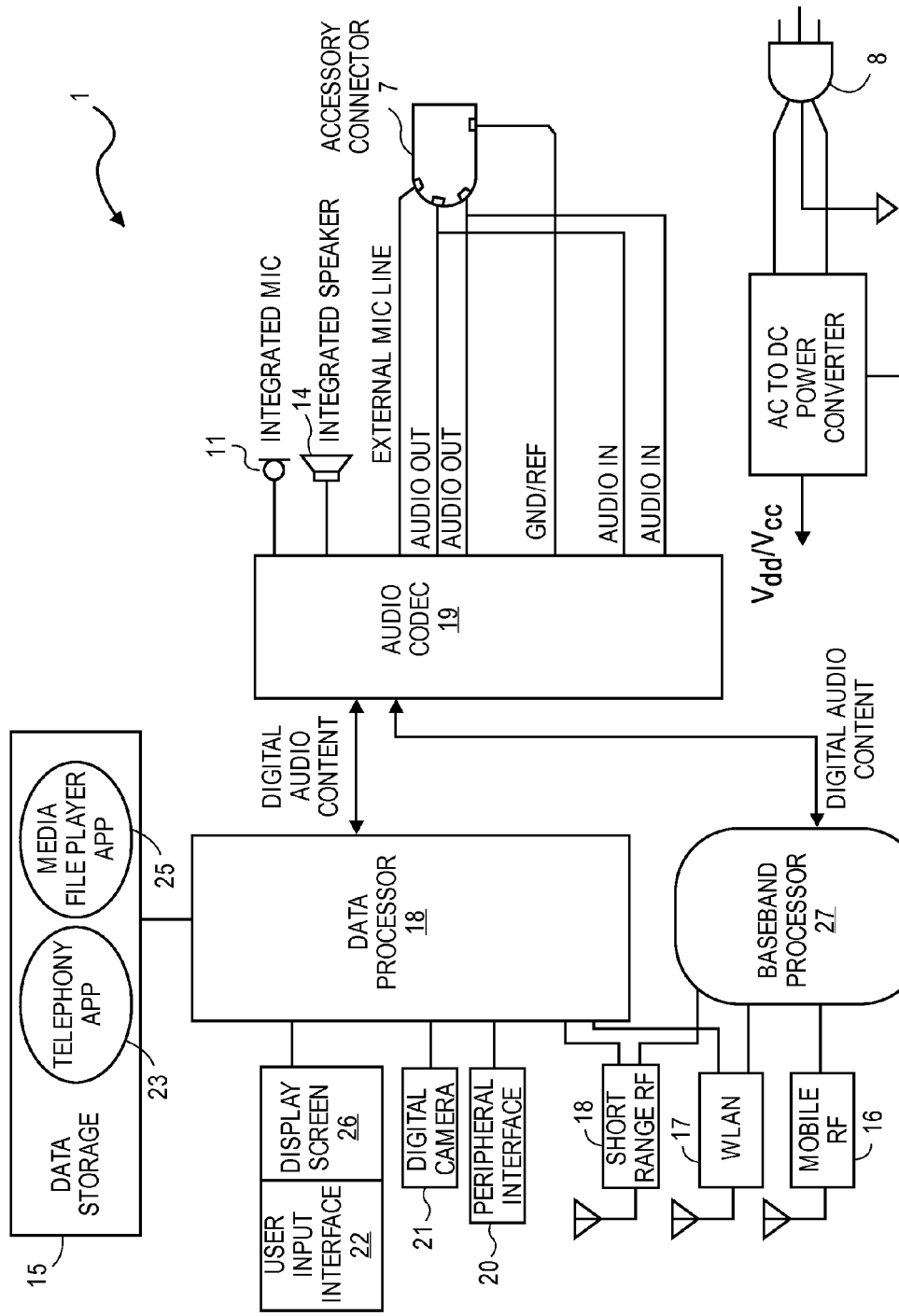
FIG. 5 is a combined block diagram and circuit schematic of relevant portions of a portable device.

A combined block diagram and circuit schematic of relevant portions of a portable device as an example of the audio source device 1 is presented in FIG. 5. Being a portable device, the system depicted in FIG. 5 is not only battery powered (not shown) but also wall-powered, via its AC to DC power converter that uses a grounded 3-prong AC wall plug 8. There are several wireless communications interfaces, including a short range RF interface 18 (e.g., Bluetooth compatible), a wireless local area network interface 17 (also referred to as WiFi), and a mobile RF interface 16 (also referred to as a cellular terrestrial radio access network transceiver). A baseband processor 27 is responsible for digital encoding and decoding of communication content in the baseband or intermediate frequency band; such content may include audio content in the form of a downlink audio signal from a remote device (not shown) that may contain, for instance, the speech of a far-end user, and an uplink signal that may contain speech of a near-end user of the audio source device 1. The system depicted in FIG. 5 also includes other hardware such as a digital camera 21, and a local or peripheral interface 20 (e.g., a docking connector and associated circuitry, a universal serial bus interface). A display screen 26 is also provided, together with a user input interface 22. The latter may be in the form of a physical keyboard or keypad, although currently a touch panel together with the display screen 26 forming a touch screen is a popular alternative.

The various functions of the audio source device 1 may be managed by a data processor 18, which in the case of a portable multi-function consumer electronic device may be an applications processor, a central processing unit, or a system on a chip (SoC). The term "data processor" is used generically here to refer to any suitable combination of data processing circuitry. The data processor 18 is programmed by instructions stored in data storage 15, depicted here as applications or modules including a telephony application 23 (to enable voice or video calls), and a media file player application 25 (to enable playback or streaming of digital audio and video files). The data storage 15 may be composed of non-volatile memory such as flash memory or a hard disk drive, in addition to random access memory. The data storage 15 may also have stored therein an audio load detector module which programs the processor 18 to analyze the audio signals so as to sense the load impedance that is attached to the accessory connector 7. The programmed processor may then control or configure the variable resistor circuit 9 as described above. This and other aspects of the various embodiments of the invention will be described next.

Audio output is achieved through the accessory connector 7, which may be integrated within the housing (not shown) of the audio source device 1 together with the hardware components depicted in FIG. 5. The accessory connector 7 may be a headphone or earphone jack, such as a 4-pin TRRS connector. The four pins include an external microphone line pin, left and right speaker pins, and a return or reference (ground) pin. Other pin assignments and jack styles are possible. In general, the connector 7 is designed to interface the audio source device 1 with an external device, namely an accessory device such as a directly powered headset, or a standalone device such as a self-powered speaker or an audio receiver (amplifier).

The pins of the accessory connector 7 are coupled to an audio coder/decoder (CODEC) 19. The CODEC 19 is an integrated circuit having a digital to analog converter (DAC), an analog to digital converter (ADC), and an audio power amplifier. The audio CODEC 19 may be a single integrated circuit die that is separately packaged by itself or in combination with other circuitry, as an audio IC package. It has, in this case, at least two analog audio output pins labeled "audio out" that are driven by their respective power amplifiers, before passing through the corresponding signal pins of the accessory connector 7. The audio content is driven by the audio CODEC 19 relative to the ground/reference pin of the connector 7. The audio content that is output by the CODEC 19 may have been originally produced or routed by the data processor 18 (e.g., while playing a digital audio file under control of the media file player app 25), or the baseband processor 18 which may be decoding and delivering a downlink speech signal during a call. The CODEC 19 also has several input pins, including an external mic line input and, in this case, at least two separate audio input pins. The external microphone line allows the audio CODEC 19 to receive input audio content from an external device, e.g. speech of a near-end user, through the mic pin of the accessory connector 7. The other audio-in pins are connected to the signal out pins of the connector 7 and may be used by the load detector 12 to sense impedance (following conversion into digital form using the built-in A/D converters). The circuitry depicted in FIG. 1B, 2B or 3B that is connected to the connector 7 may be substantially integrated within the codec 19.

While certain embodiments have been described and shown in the accompanying drawings, it is to be understood that such embodiments are merely illustrative of and not restrictive on the broad invention, and that the invention is not limited to the specific constructions and arrangements shown and described, since various other modifications may occur to those of ordinary skill in the art. The description is thus to be regarded as illustrative instead of limiting.

What is claimed is:

1. An audio apparatus comprising:
   an audio source;
   an audio connector having a signal out pin and a return pin to be connected to an external audio load;
   a differential input amplifier having a signal input coupled to the audio source, an output coupled to the signal out pin of the connector, and a feedback input;
   a variable resistor circuit to provide a variable resistance that is within a range of 1 to 60 Ohms between a first node and a second node, the variable resistor circuit having a control input for setting the variable resistance, wherein the first node is directly connected to the return pin of the connector and to the feedback input of the differential input amplifier, and the second node is directly connected to a ground plane of the apparatus;
   a switch circuit having a first terminal coupled to the first node, a second terminal coupled to the second node, and a control input for setting the switch circuit into an open state and a closed state; and
   a load detector having outputs that are coupled to the control inputs of the variable resistor circuit and the switch circuit, wherein the load detector is used to detect the type of external audio load that is connected to the connecter and on that basis a) set the switch circuit into one of the open state and the closed state, and b) set the variable resistance.

2. The audio apparatus of claim 1 wherein the audio source comprises:
   a digital audio processor; and
   a digital to analog converter having an input coupled to the digital audio processor and an output coupled to the signal input of the differential input amplifier, and wherein in its closed state the switch circuit short circuits the variable resistor circuit.

3. The audio apparatus of claim 1 further comprising a portable personal audio device housing in which the audio source and the connector are integrated, and wherein in its closed state the switch circuit short circuits the variable resistor circuit.

4. The audio apparatus of claim 3 further comprising:
a further connector having a signal pin and a return pin to be connected to the external audio load; and
a data driver circuit having an output coupled to the signal pin of the further connector, and being coupled to the ground plane of the apparatus and to the return pin of the further connector.

5. The audio apparatus of claim 1 further comprising:
an AC-DC power converter; and
an AC wall-power connector coupled to an input of the AC-DC power converter, the wall power connector having a power pin, a neutral pin, and a ground pin, wherein the ground pin of the power connector is coupled to the ground plane of the audio apparatus.

6. The audio apparatus of claim 1 further comprising:
a signal-in amplifier having an input,
wherein the audio connector has a further signal out pin and a signal-in pin, the signal-in pin being coupled to the input of the signal-in amplifier.

7. An audio apparatus comprising:
means for producing an audio signal;
means for amplifying the audio signal while coupled to a ground plane of the apparatus;
means for electrically connecting the amplified audio signal to an external sound producing device through a signal out pin and a return pin;
means for providing a variable resistance path that connects a first node and a second node, wherein the first node is directly connected to the return pin and is directly connected, but not through the variable resistance path, to a feedback input of the amplifier means, and the second node is directly connected to the ground plane of the apparatus;
means for alternately creating a short circuit and an open circuit, across the first and second nodes; and
means for sensing impedance out through the signal out pin, and on that basis a) controlling whether or not the first and second nodes are short circuited to each other by said creating means, and b) setting resistance of the variable resistance path.

8. The apparatus of claim 7 further comprising means for housing a) the audio signal producer means, b) the amplifier means, and c) the electrical connector means, and wherein the resistance of the variable resistance path is within a range of 1 to 60 Ohms.

9. The apparatus of claim 7 further comprising:
means for driving a data signal while being coupled to the ground plane of the apparatus; and
a further means for electrically connecting the driven data signal to the external sound producing device.

10. The apparatus of claim 7 further comprising:
means for converting AC power to DC power; and
a further means for electrically connecting the power converting means to an AC wall outlet, including a ground pin that is coupled to the ground plane of the audio apparatus.

11. The audio apparatus of claim 7 wherein the electrical connector means has a further signal out pin and a signal-in pin, the audio apparatus further comprising means for amplifying an input signal received through the signal-in pin.

12. A method for operating an audio source device having an audio connector, comprising:
determining that one of a low impedance load or a high impedance load is connected to a signal-out pin of the audio connector, and, based on the determined load, one of
a) short circuiting across a variable resistor that provides a variable resistance within a range of 1 to 60 Ohms connected in series between a return pin of the audio connector and a circuit ground, or
b) setting a resistance value of the variable resistor in accordance with the determined load, and maintaining the as-set variable resistor as connected in series between the return pin and the circuit ground; and
amplifying an audio signal that is then driven through the signal-out pin of the connector, while using a) feedback from the return pin of the connector and b) a power supply return path through the circuit ground.

13. The method of claim 12 wherein determining the load comprises sensing impedance through the signal-out pin of the audio connector and comparing the sensed impedance to a predetermined range.

14. The method of claim 12 further comprising:
driving a data signal, while using the circuit ground, through a data connector, wherein a return pin of the data connector and the return pin of the audio connector are connected to each other by an external short circuit.

15. The method of claim 12 further comprising:
converting AC power from an AC wall outlet into DC power, to enable amplifying the audio signal, while a ground pin of the AC wall outlet is connected to the circuit ground through a short circuit.

16. The method of claim 12 further comprising:
amplifying a further audio signal that is then driven through a further signal-out pin of the audio connector, while using a) feedback from the return pin of the connector and b) a power supply return path through the circuit ground.

17. The method of claim 16 further comprising
amplifying an input signal received through a signal-in pin of the audio connector.

* * * * *